US011177000B2

(12) United States Patent
Wu et al.

(10) Patent No.: US 11,177,000 B2
(45) Date of Patent: Nov. 16, 2021

(54) NON-VOLATILE MEMORY AND OPERATING METHOD THEREOF

(71) Applicant: MACRONIX INTERNATIONAL CO., LTD., Hsinchu (TW)

(72) Inventors: Guan-Wei Wu, Zhubei (TW);
Yao-Wen Chang, Zhubei (TW);
Chih-Chieh Cheng, Zhubei (TW);
I-Chen Yang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 49 days.

(21) Appl. No.: 16/445,362

(22) Filed: Jun. 19, 2019

(65) Prior Publication Data

US 2020/0381053 A1 Dec. 3, 2020

(30) Foreign Application Priority Data

May 31, 2019 (TW) .................. 10811905.7

(51) Int. Cl.
| | | |
|---|---|---|
| *G11C 16/10* | (2006.01) | |
| *H01L 27/1157* | (2017.01) | |
| *G11C 11/56* | (2006.01) | |
| *G11C 16/26* | (2006.01) | |
| *G11C 16/08* | (2006.01) | |
| *G11C 16/24* | (2006.01) | |
| *G11C 16/34* | (2006.01) | |

(52) U.S. Cl.
CPC .......... *G11C 16/10* (2013.01); *G11C 11/5671* (2013.01); *G11C 16/08* (2013.01); *G11C 16/24* (2013.01); *G11C 16/26* (2013.01); *G11C 16/3459* (2013.01); *H01L 27/1157* (2013.01)

(58) Field of Classification Search
CPC ..... G11C 16/10; G11C 16/08; G11C 16/0483; G11C 11/5671; G11C 16/26; G11C 16/24; G11C 16/3459; H01L 27/1157
See application file for complete search history.

(56) References Cited

U.S. PATENT DOCUMENTS

| | | | |
|---|---|---|---|
| 6,366,496 B1 | 4/2002 | Torelli et al. | |
| 2004/0228180 A1 | 11/2004 | Matsuoka et al. | |
| 2009/0040833 A1* | 2/2009 | Shin | G11C 16/10 |
| | | | 365/185.19 |
| 2009/0238007 A1* | 9/2009 | Jang | G11C 16/3427 |
| | | | 365/185.19 |

(Continued)

OTHER PUBLICATIONS

Kang-Deog Suh, et al. "A 3.3 V 32 Mb NAND Flash Memory with Incremental Step Pulse Programming Scheme." IEEE Journal of Solid-State Circuits, vol. 30, No. 11, 1995, pp. 1149-1156., doi:10.1109/4.475701. (Year: 1995).*

*Primary Examiner* — Jay W. Radke
(74) *Attorney, Agent, or Firm* — McClure, Qualey & Rodack, LLP

(57) ABSTRACT

An operating method of a non-volatile memory includes: generating a first programming pulse with a first time period to a target memory cell in a memory array; reading and verifying whether a threshold voltage of the target memory cell reaches a target voltage level; and generating a second programming pulse with a second time period to the target memory cell when the threshold voltage of the target memory cell does not reach the target voltage level, wherein the second time period is longer than the first time period.

16 Claims, 12 Drawing Sheets

(56) References Cited

U.S. PATENT DOCUMENTS

| | | | |
|---|---|---|---|
| 2009/0257281 A1* | 10/2009 | Lee .................... | G11C 16/3454 365/185.19 |
| 2010/0067305 A1* | 3/2010 | Park ....................... | G11C 16/12 365/185.19 |
| 2010/0124120 A1* | 5/2010 | Park .................... | G11C 16/0483 365/185.19 |
| 2010/0195387 A1* | 8/2010 | Park .................... | G11C 11/5628 365/185.03 |
| 2011/0164457 A1 | 7/2011 | Seol et al. | |
| 2013/0314987 A1 | 11/2013 | Hemink et al. | |
| 2016/0078950 A1* | 3/2016 | Lee .................... | G11C 16/3445 365/185.19 |

\* cited by examiner

100

NON-VOLATILE MEMORY AND OPERATING METHOD THEREOF

RELATED APPLICATIONS

This application claims priority to Taiwan Application Serial Number 108119057, filed May 31, 2019, which is herein incorporated by reference.

BACKGROUND

Technical Field

The disclosure relates to a non-volatile memory and a non-volatile memory operating method, particularly to a non-volatile memory and an operating method thereof for improving increment step programming pulse.

Description of Related Art

With development of technology, more and more products need memory. 3D nitride-based flash memory for high-density data storage is therefore popular.

Conventionally, increment step programming pulse (ISPP) may be used to perform programing in 3D nitride-based flash memory. However, repeated programming operation will increase the time of verification and reduce the efficiency of programming.

Therefore, how to make sure the accuracy of programming and improve the efficiency of operation at the same time is one of the important issues in this field.

SUMMARY

One aspect of the present disclosure is a non-volatile memory operating method including: generating a first programming pulse with a first time period to a target memory cell in a memory array; reading and verifying whether a threshold voltage of the target memory cell reaches a target voltage level; and generating a second programming pulse with a second time period to the target memory cell when the threshold voltage of the target memory cell does not reach the target voltage level, wherein the second time period is longer than the first time period.

Another aspect of the present disclosure is a non-volatile memory including a memory array, a voltage generator and a read-write controller. The memory array includes multiple memory cells. Each of memory cells has an adjustable threshold voltage. The voltage generator is coupled to the memory array and configured to generate a programming voltage to perform a programming operation to a target memory cell in the memory array. The programming operation is configured to arrange the threshold voltage of the target memory cell. A read-write controller is coupled to the voltage generator. The read-write controller is configured to control the voltage generator to generate a first programming pulse with a first time period to the target memory cell, read and verify whether a threshold voltage of the target memory cell reaches a target voltage level, and control the voltage generator to generate a second programming pulse with a second time period to the target memory cell when the threshold voltage of the target memory cell does not reach the target voltage level. The second time period is longer than the first time period.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1A:
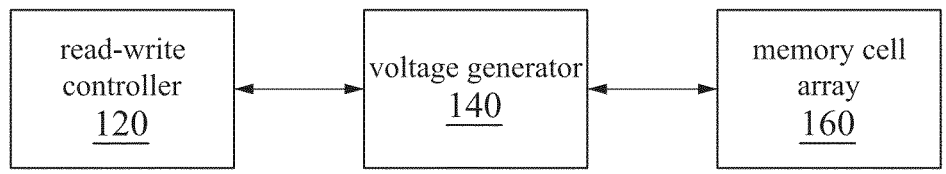
FIG. 1A is a function block diagram illustrating a non-volatile memory in accordance with some embodiments of the disclosure.
Figure 1B:
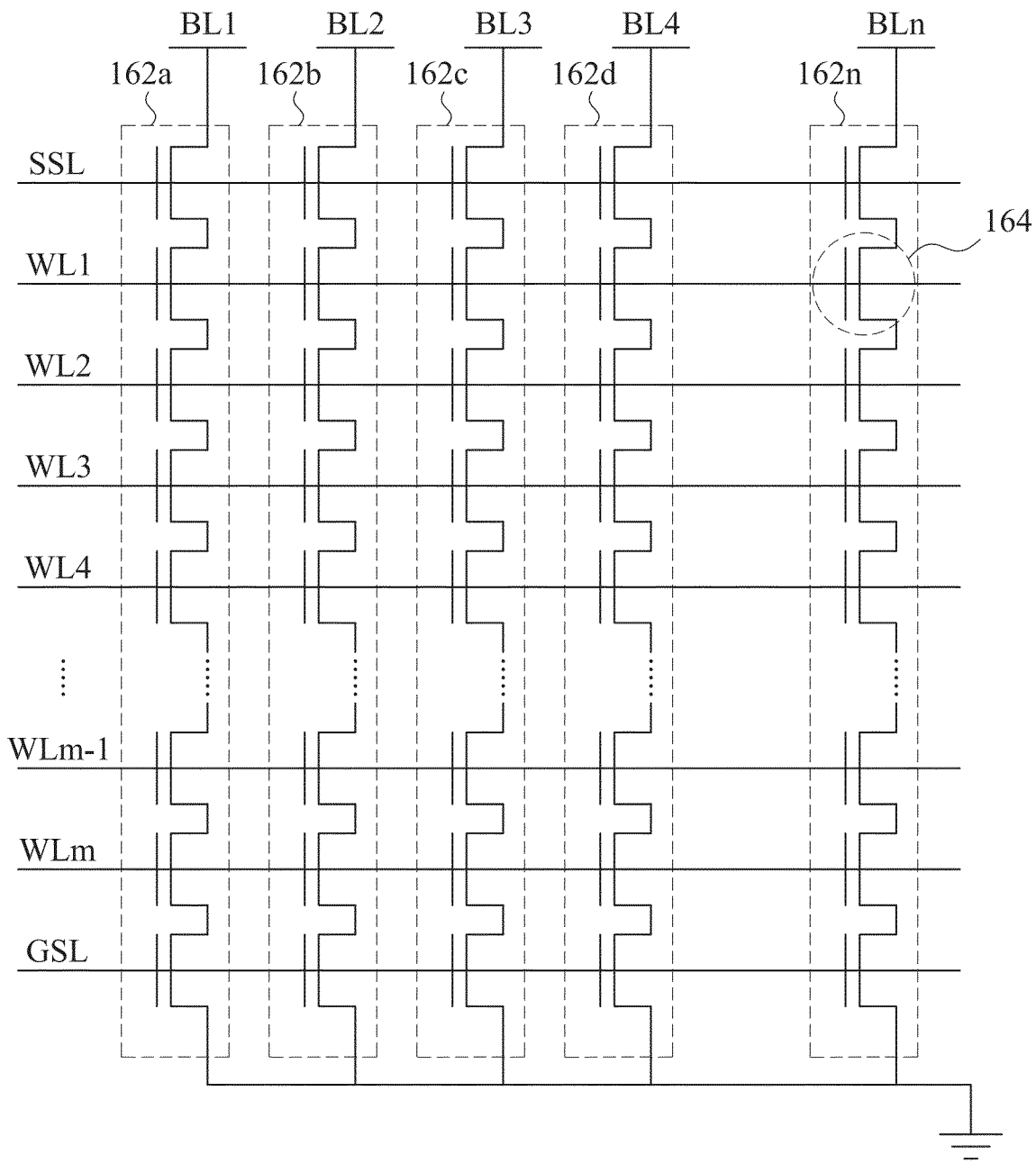
FIG. 1B is a schematic diagram illustrating a circuit of a memory array in accordance with embodiment of FIG. 1A.

Please refer to FIG. 1A and FIG. 1B, FIG. 1A is a function block diagram illustrating a non-volatile memory 100 in accordance with some embodiments of the disclosure, FIG. 1B is a schematic diagram illustrating a circuit of a memory array 160 in the non-volatile memory 100 in accordance with embodiment of FIG. 1A. As shown in FIG. 1A, the non-volatile memory includes a read-write controller 120, a voltage generator 140 and a memory array 160. As shown in FIG. 1B, the memory array 160 includes a plurality of memory cells 164 arranged in an array. In the embodiments of FIG. 1B, the memory array 160 includes a string select line SSL, a ground select line GSL, word lines WL1~WLm, bit line BL1~BLn and a plurality of memory strings 162a~162n.

Each of memory strings 162a-162n includes multiple memory cells 162 connected in series at the same bit line, for instance, the memory string 162a includes all memory cells 164 connected in series at the bit line BL1, the memory string 162b includes all memory cells 164 connected in series at the bit line BL2, and so on, the memory string 162n includes all memory cells 164 connected in series at the bit line BLn. The number of the memory cells in series included by each of memory string 162n depends on the number of word lines WL1~WLm, that is, the number of the memory cells in series included by each of memory string 162n is related to the total storage capacity of the non-volatile memory 100. For example, if the non-volatile memory 100 includes 56 word lines, each of memory strings 162n may include 56 memory cells 164 connected in series, but not limited to this disclosure.

As shown in FIG. 1A, in structure, the read-write controller 120 is coupled to the voltage generator 140. The voltage generator 140 is coupled to a memory array 160. In operation, the read-write controller 120 controls the memory array 160 to perform programming, reading, erasing or other operations through the voltage generator 140. Specifically, the read-write controller 120 may control the voltage generator 140 to generate multiple operation voltages to output to the corresponding memory strings or memory cells in the memory array 160. In some embodiments, operation voltages include programming voltage, passing voltage, various passing voltage, bit line voltage, sting select voltage or other operation voltages, not limited to these.

The read-write controller 120 may control the voltage generator 140 to generate word-line select voltage to the word lines WL1~WLm, for example, the read-write controller 120 may select one word line WL3, and disable (supply a low voltage level to) the other word lines WL1, WL2, WL4~WLm, so as to program, read, erase, or reset memory cells 164 of different bits in the word line WL3. At this time, signal of each bit lines BL1~BLn may be supplied individually, so as to perform operation to the memory cell 164 in the word line WL3 of each memory strings 162a~162n. At this time, read-write controller 120 may control the voltage generator 140 to generate different bit-line data voltage to the bit lines BL1~BLn above, so as to operate multiple memory strings 162a-162n respectively.

In this disclosure, each of the memory cells 164 has an adjustable threshold voltage, and the read-write controller 120 supplies the programming voltage through one of bit lines BL1~BLn to perform programming, so as to adjust the threshold voltage of each memory cell 164. For example, to store logic data "1" in memory cell 164, the threshold voltage may be adjusted to high level by a programming voltage, and to store logic data "0" in memory cell 164, the threshold voltage may be adjusted to low level by another programming voltage. Then, during the reading operation, the level of the threshold voltage of each memory cell 164 above is read to be high/low to distinguish the logic data stored in the memory cell 164.

In some embodiments, the non-volatile memory 100 may be floating gate memory, charge trapping memory, 2D NAND flash memory, 3D NAND flash memory or other nitride-based flash memory, not limited to these.

Figure 2A:
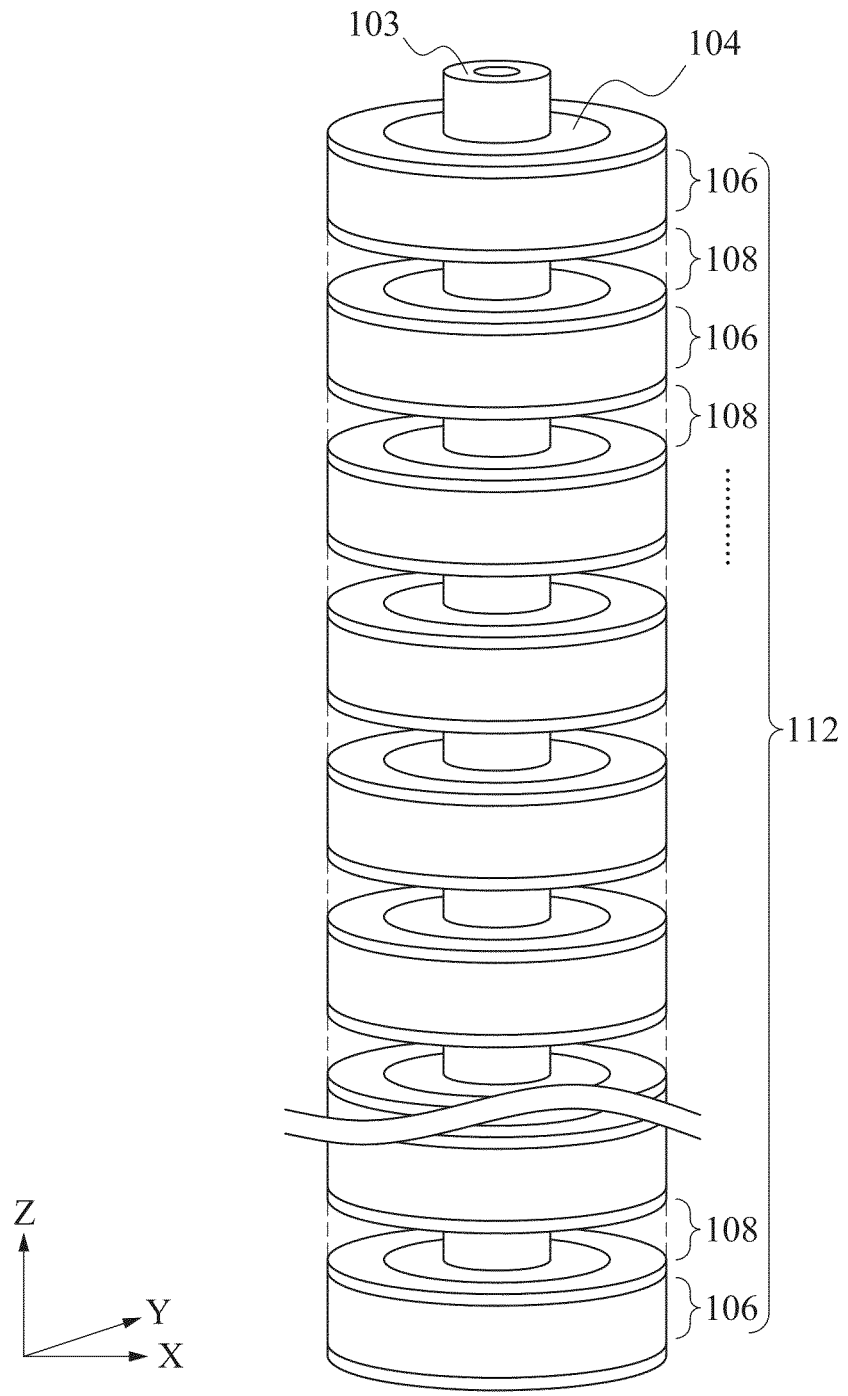
FIG. 2A is a schematic diagram illustrating a structure of a memory string in accordance with some embodiments of the disclosure.

Please refer to FIG. 2A. FIG. 2A is a schematic diagram illustrating a structure of a memory string 162 in accordance with some embodiments of the disclosure. As shown in FIG. 2A, the memory string 162 includes a channel layer 103, a memory layer 104, a conductive layer 106 and an insulating layer 108. In this embodiment, in the vertical projection direction (i.e., Z direction), the conductive layer 106 and the insulating layer 108 are staggered to form a stack 112. In the vertical projection plane (i.e., XY plane), the channel layer 103, the memory layer 104 and the stack 112 are concentric circles. The memory layer 104 is arranged between the channel layer 103 and the stack 112.

Figure 2B:
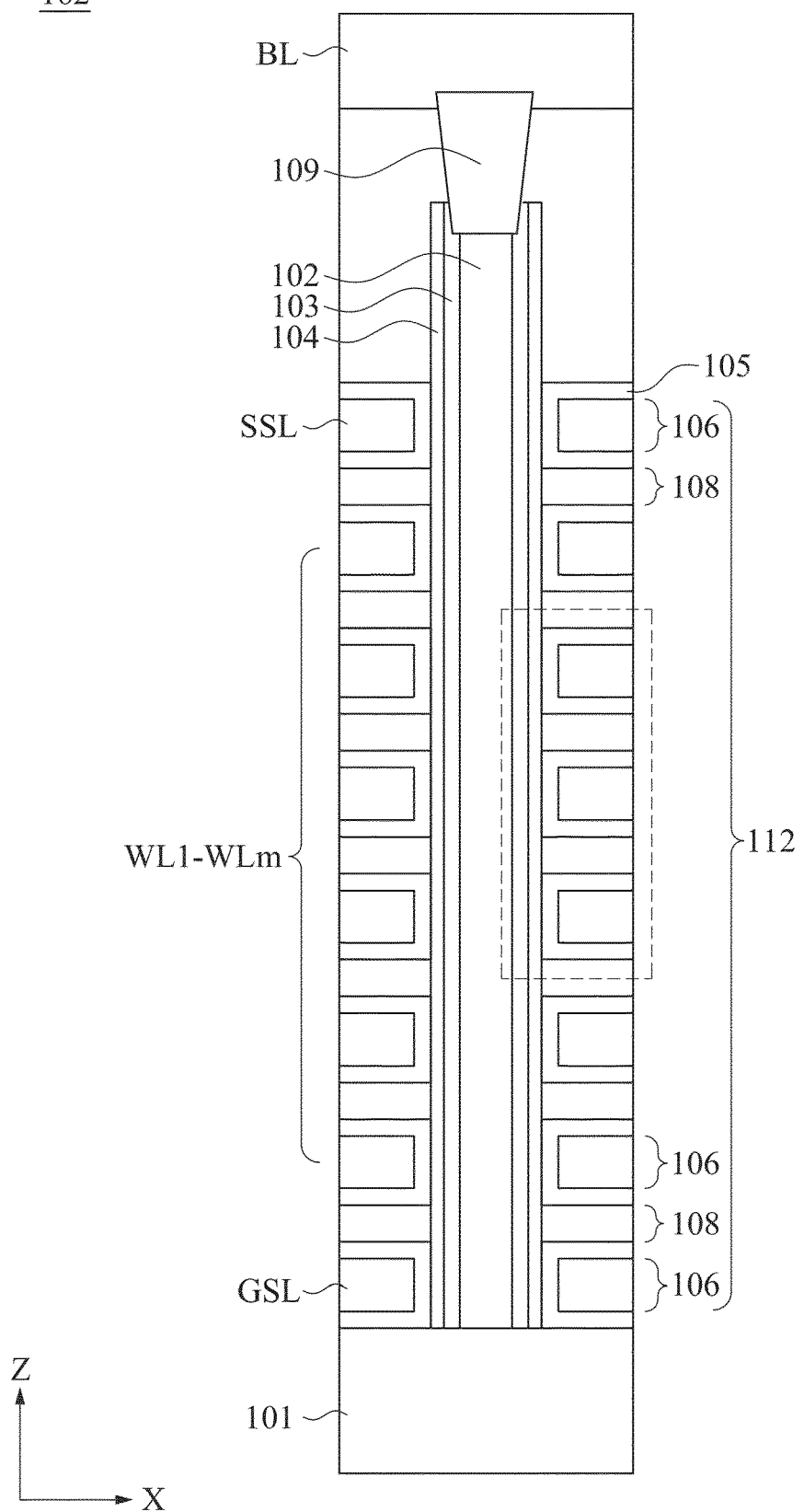
FIG. 2B is a schematic diagram illustrating a section of a memory string in accordance with embodiment of FIG. 2A.

Specifically, please refer to FIG. 2B. FIG. 2B is a schematic diagram illustrating a section of a memory string 162 in accordance with embodiment of FIG. 2A. In FIG. 2B, the elements similar to those in FIG. 2A are denoted by the same reference symbols. In this embodiment, the memory string 162 includes a substrate 101, an insulating layer 102, the channel layer 103, the memory layer 104, a dielectric layer 105, the conductive layer 106, the insulating layer 108 and a conductive element 109. As shown in FIG. 2B, in Z direction, the conductive layer 106 and the insulating layer 108 are staggered to form the stack 112. And in Z direction, the stack 112 is arranged on the substrate 101. In some embodiments, dielectric layer 105 is included between the conductive layer 106 and the insulating layer 108.

Furthermore, as shown in FIG. 2B, in Z direction, the channel 103 of annular columnar structure is arranged on the substrate 101 and passes through the stack 112. In the section parallel to Z axis, the insulating layer 102 is arranged at the middle of the channel layer 103, and the memory layer 104 is arranged on both outer sides of the channel layer 103. In other words, the memory layer 104 isolates the channel layer 103 and the conductive layer 106.

Figure 2C:
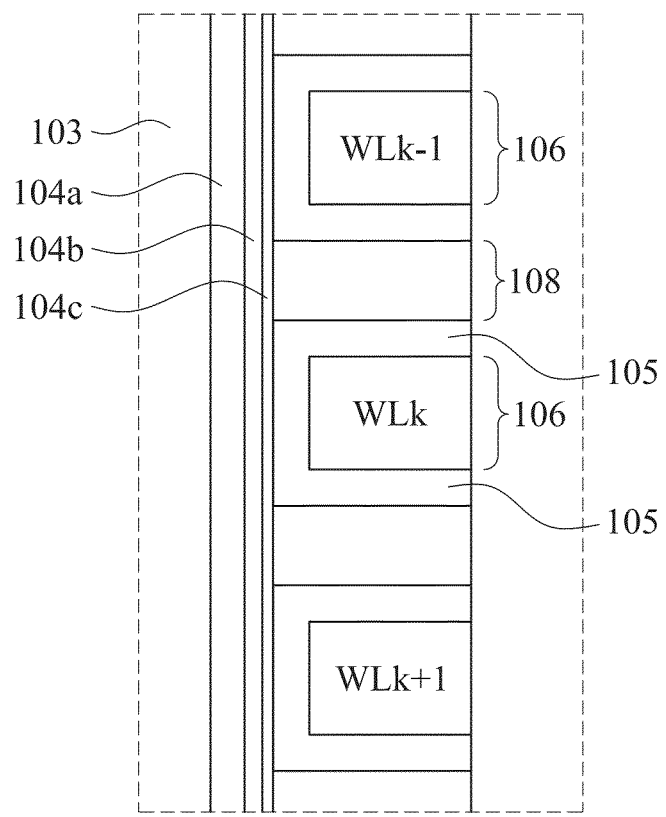
FIG. 2C is a schematic diagram illustrating a closer section of a memory string in accordance with embodiment of FIG. 2B.

About the memory layer 104, please refer to FIG. 2C. FIG. 2C is a schematic diagram illustrating a closer section of a memory string 162 in accordance with embodiment of FIG. 2B. As shown in FIG. 2C, the memory layer 104 includes a tunnel oxide 104a, a charge trapping layer 104b and a blocking layer 104c. In structure, the tunnel oxide 104a is adjacent to the channel layer 103. The charge trapping layer 104b is adjacent to the tunnel oxide 104a. The blocking layer 104c is adjacent to the charge trapping layer 104b. In this embodiment, the dielectric layer 105 in the stack 112 is adjacent to the blocking layer 104c. In other words, in the closer section parallel to the Z axis, the structures sequentially arranged from the axis of the annular columnar channel layer 103 are the tunnel oxide 104a, the charge trapping layer 104b, the blocking layer 104c and the stack 112 including the conductive layer 106 and the insulating layer 108.

In some embodiments, the channel layer 103 may be realized by polysilicon. The tunnel oxide 104a, the charge trapping layer 104b and the blocking layer 104c of the memory layer 104 may be stacked by Oxide-Nitride-Oxide (ONO). In some embodiments, the conductive layer 106 may be formed by a conductive polycrystalline silicon (poly-Si) material, a metal material or another conductive material. As shown in FIG. 2B, the dielectric layer 105 can be a high dielectric constant (High-K) layer, which surrounds the conductive layer 106. In an embodiment, the dielectric layer 105 can be formed by a $Al_2O_3$ material layer or any equivalent material with high dielectric constant. The insulating layer 108 may be oxide. It should be noted that material above is merely examples, and not intended to limit the present disclosure. Those skilled in the art may design structure and material according to the actual needs.

In some embodiments, as shown in FIG. 2B, one of conductive layers 106 closest to the substrate 101 is used as the ground select line GSL. One of conductive layers 106 furthest away to the substrate 101 is used as the string select line SSL. And the other conductive layers 106 are sequentially used as the word lines WL1~WLm. Furthermore, the conductive element 109 is arranged on the insulating layer 102, so that the channel 103 is electrically coupled to the bit line BL through the conductive element 109. And the multiple memory cells are defined by the intersection of the channel layer 103 and the stack 112.

Figure 3:
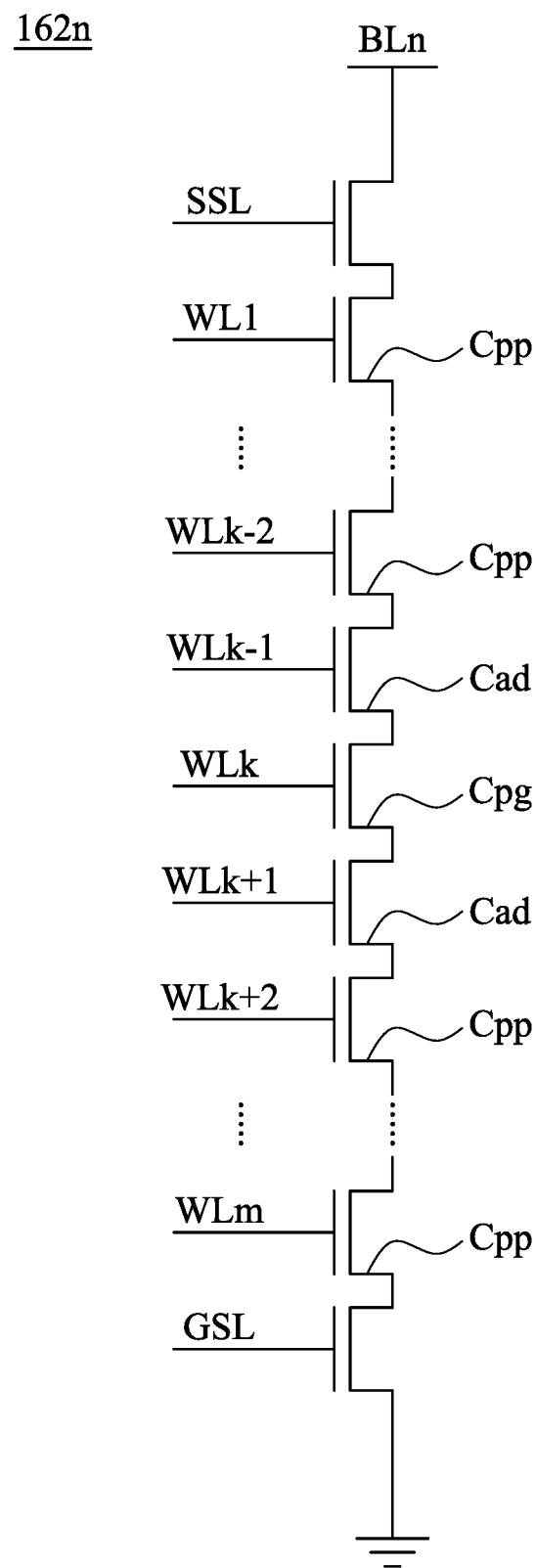
FIG. 3 is a schematic diagram illustrating a circuit of a memory string in accordance with embodiment of FIG. 1B.

Please refer to FIG. 3. FIG. 3 is a schematic diagram illustrating a circuit of a memory string 162n in accordance with embodiment of FIG. 1B. For the convenience and clarity of explanation, one of the memory strings 162n is taken as an example from FIG. 1B to FIG. 3 for illustrative illustration, in practical applications, the following operational description may be applied to any column of memory strings 162a-162n in the non-volatile memory 100 in FIG. 1B. As shown in FIG. 3, the memory string 162n includes multiple memory cells connected in series at the same bit line BLn. The memory string 162n may be realized by the structure in FIG. 2A~FIG. 2C above, thus further explanation is omitted. It should be noted that the structure in FIG. 2A~FIG. 2C above is merely examples but not intended to limit the present disclosure and those skilled in the art may design structure and material according to the actual needs.

In the non-volatile memory 100, to store data may be achieved by changing the threshold voltage of the memory cell. In the following embodiments mainly explains how to perform programming to one of memory cells in memory string 162n, that is, how to program the threshold voltage of the memory cell. In the following embodiments, the memory cell to be programmed is called a target memory cell Cpg, and in the memory string 162n, except the target memory cell Cpg, there are other memory cells, such as adjacent memory cells Cad located on both sides of the target memory cell Cpg, and other non-adjacent memory cells Cpp.

In the embodiments of FIG. 3, assume that the target memory cell Cpg to be programmed is in the k-th word line WLk, then two memory cells connected to the adjacent word lines WLk−1 and WLk+1 are the adjacent memory cells Cad, and other memory cells not next to the target memory cell Cpg are non-adjacent memory cells Cpp in the word lines WL1~WLk−2 and WLk+2~WLm.

In operation, the non-volatile memory 100 is configured to perform programming operation to the target memory cell Cpg in the memory array 160 according to the non-volatile memory operation method 400. The programming operation is configured to arrange the threshold voltage of the target memory cell Cpg. Specifically, the read-write controller 120 in the non-volatile memory 100 may repeatedly execute the program of electronic pulse shot, so as to program the memory cell to the target state.

Further explanation, during every programming program, the read-write controller 120 may supply pulses with different voltage levels to the corresponding word lines WL1~WLm connected to the memory cells Cpg, Cad and Cpp through the voltage generator 140. The read-write controller 120 control the voltage generator 140 to generate passing voltage to the other memory cells (including the adjacent memory cell Cad and the non-adjacent memory cell Cpp) except the target memory cell Cpg, the adjacent memory cell Cad and the non-adjacent memory cell Cpp will be conducted according to the passing voltage, so that the signal in the bit line BLn is able to arrival to the target memory cell Cpg.

At the same time, the read-write controller 120 controls the voltage generator 140 to generate the higher programming voltage to the word line WLk of the target memory cell Cpg, generally speaking, the programming voltage is higher than the passing voltage. Please refer to FIG. 2C, the higher programming voltage is configured to generate electrical field to attract electrons of the channel layer 103 to the charge trapping layer 104b, so that the threshold voltage of the memory cell (i.e., Cpg in FIG. 3) corresponding to the word line WLk be changed to complete the programming operation. In practical applications, the programming voltage may include multiple programming pulses, the threshold voltage of the target memory cell Cpg may be staged adjusted to the target voltage level by using multiple programming pulses. In this way, the memory cell is able to reach the target voltage level of programming after repeated pulses shots.

Figure 4:
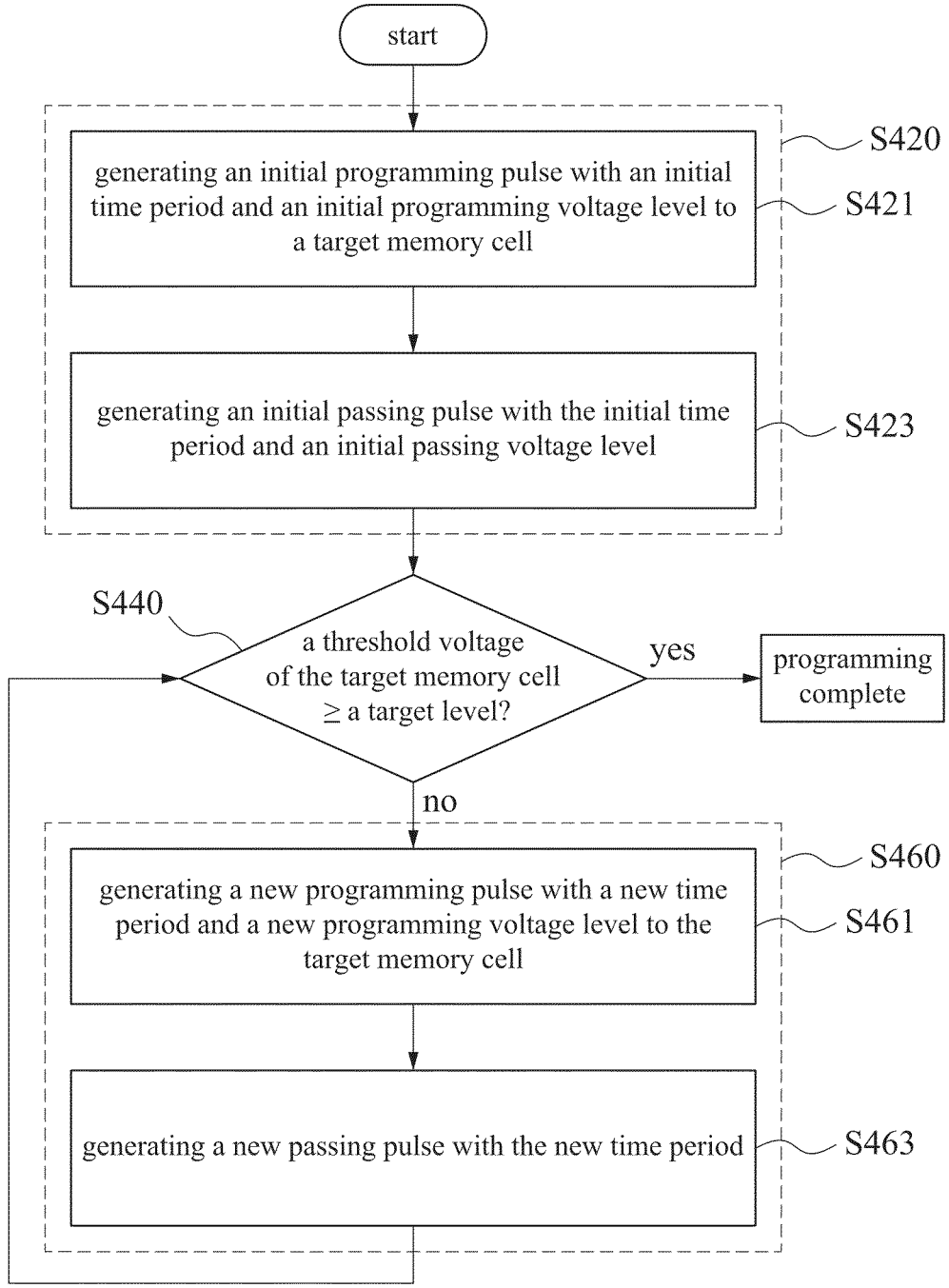
FIG. 4 is a flowchart of a non-volatile memory operation method illustrated in accordance with some embodiments of the disclosure.
Figure 5:
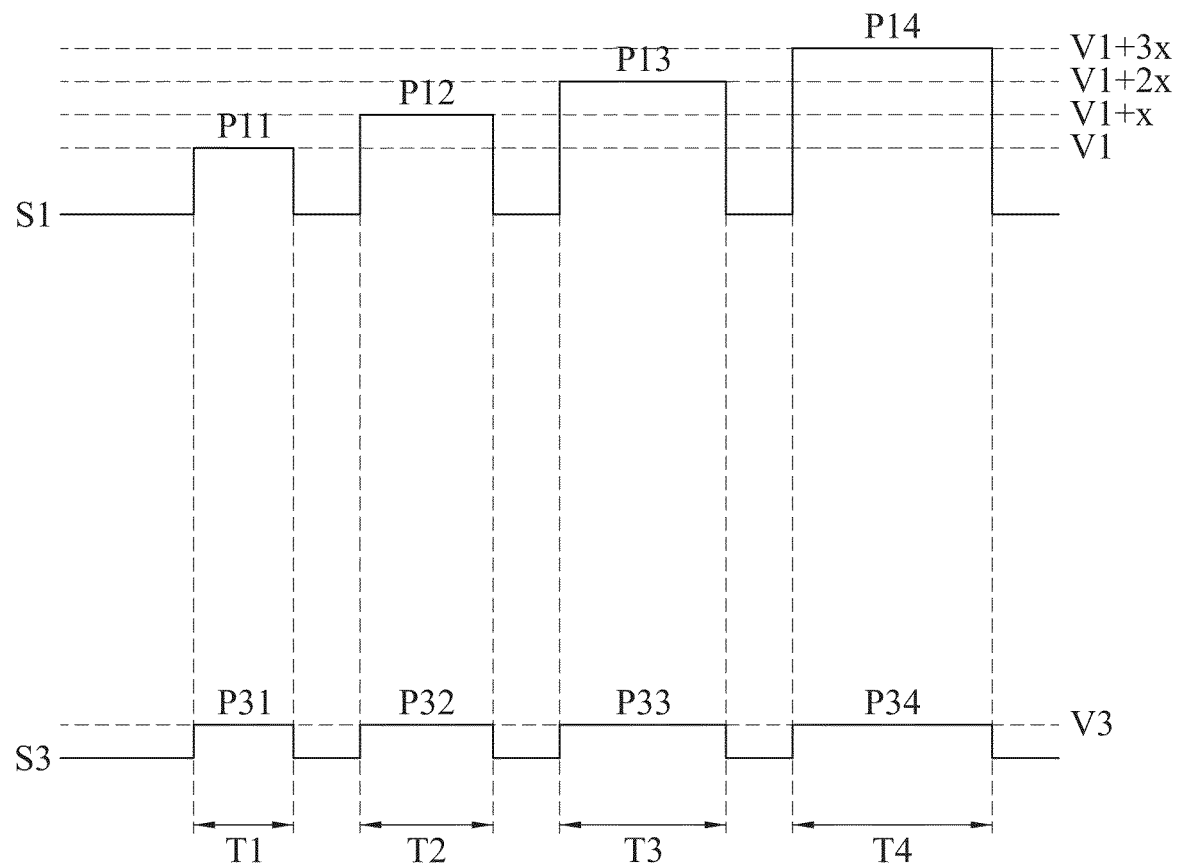
FIG. 5 is a waveform diagram of pulses illustrated in accordance with some embodiments of the disclosure.

The detailed operation will be explained in accompany with FIG. 4 and FIG. 5. FIG. 4 is a flowchart of a non-volatile memory operation method 400 illustrated in accordance with some embodiments of the disclosure. FIG. 5 is a waveform diagram of pulses illustrated in accordance with some embodiments of the disclosure. As shown in FIG. 4, the non-volatile memory operation method 400 includes operations S420, S440 and S460. The operation S420 includes operations S421 and S423. The operation S460 includes operations S461 and S463.

In operation S420, controlling, by the read-write controller 120, the voltage generator 140 to generate initial pulses with an initial time period to the corresponding memory cells respectively. Specifically, an initial programming pulse is generated and supplied to the target memory cell Cpg, and a passing pulse is generated and supplied to the other memory cells (including the adjacent memory cells Cad and the non-adjacent memory cells Cpp) except the target memory cell Cpg. Next, in operation S440, reading and verifying, by the read-write controller 120, the threshold voltage of the target memory cell Cpg whether reaches the target voltage level (i.e., voltage level representing logic 1.) When the threshold voltage of the target memory cell Cpg does not reach the target level, operation S460 is executed, controlling, by the read-write controller 120, the voltage generator 140 to generate pulses with new time period and new voltage level to the corresponding memory cells. Then, operation S440 is executed again, reading and verifying again, by the read-write controller 120, the threshold voltage of the target memory cell Cpg whether reaches the target voltage level. It is repeated until the threshold voltage of the target memory cell Cpg reaches the target level, then the program is completed and programming operation is ended.

In other words, every time after pulse shot, the threshold voltage of the target memory cell Cpg is detected to decide whether complete the programming operation. In this way, it is able to achieve a relatively high accuracy in the programming operation by repeatedly increasing the voltage level of the pulses step by step until the threshold voltage in the target memory cell Cpg reaches the target level and passes the calibration. In addition, by increasing the length of the pulse stepwise, and the efficiency of the programming operation can be improved.

Further detailed operations are as follows. In operation S421, controlling, by the read-write controller 120, the voltage generator 140 to generate the initial programming pulse with the initial time period to the target memory cell Cpg, and the initial programming pulse has an initial programming voltage level. Specifically, the programming voltage received by the target memory cell Cpg from the word line WLk is as shown by the signal waveform S1 in FIG. 5. The read-write controller 120 controls the voltage generator 140 to generate the initial programming pulse P11 with the initial time period T1 to the target memory cell Cpg. For example, in some embodiments, the time period T1 may be about 5 microseconds. The initial programming voltage level V1 may be about 13 volts.

Then, in operations S423, controlling, by the read-write controller 120, the voltage generator 140 to generate the passing pulse with the initial time period to the other memory cells (including the adjacent memory cell Cad and the non-adjacent memory cell Cpp) except the target memory cell Cpg, and the passing pulse has a passing voltage level. Specifically, the passing voltage received by the other memory cells Cad, Cpp from the word lines WL1~WLk−1 and WLk+1~WLm is as shown by the signal waveform S3 in FIG. 5. The read-write controller 120 controls the voltage generator 140 to generate the passing pulse P31 with the initial time period T1 to the other memory cells (including the adjacent memory cell Cad and the non-adjacent memory cell Cpp) except the target memory cell Cpg. For example, in some embodiments, the passing voltage level V3 may be about 8 volts.

Next, in operation S440, determining, by the read-write controller 120, whether the threshold voltage of the target memory cell Cpg reaches the target level. Specifically, when the threshold voltage of the target memory cell Cpg reaches the target voltage level, it means that the target memory cell Cpg reaches the target state of logic 1, then the program may be completed and the programming operation may be ended. On the other hand, when the threshold voltage of the target memory cell Cpg does not reach the target voltage level, it means that the target memory cell Cpg does not reach the target state of logic 1, then it is ready to generate the next new pulse shot.

About the detailed description of the time period and voltage level of the new pulse is as follows. In operation S461, controlling, by the read-write controller 120, the voltage generator 140 to generate a new programming pulse with a new time period to the target memory cell Cpg, and the new programming pulse has a new programming voltage level. Furthermore, the new programming voltage level is higher than the initial programming voltage level. Specifically, as shown in FIG. 5, the read-write controller 120 controls the voltage generator 140 to generate the programming pulse P12 with time period T2 to the target memory cell Cpg. For example, in some embodiments, the time period T2 may be about 5.8 microseconds. In other words, the time period T2 is longer than the time period T1, i.e., T2>T1. The new programming voltage level V1+x may be about 14 volts. In other words, each additional programming voltage x may be approximately 1 volt.

Then, in operation S463, controlling, by the read-write controller 120, the voltage generator 140 to generate the passing pulse with new time period to the other memory cells (including the adjacent memory cell Cad and the non-adjacent memory cell Cpp) except the target memory cell Cpg, and the passing pulse has the passing voltage level. Specifically, as shown in FIG. 5, the read-write controller 120 controls the voltage generator 140 to generate the passing pulse P32 with time period T2 to the other memory cells (including the adjacent memory cell Cad and the non-adjacent memory cell Cpp) except the target memory cell Cpg. For example, in some embodiments, the passing voltage level V3 may be about 8 volts.

Similarly, as shown in FIG. 5, another programming pulse P13 with a time period T3 and another programming pulse P14 with a time period T4 will be generated afterward. In the embodiment shown in FIG. 5, the time period T3 of the programming pulse P13 will be longer than the time period T2 of the programming pulse P12, and the time period T4 of the programming pulse P14 will be longer than the time period T3 of the programming pulse P13. In other words, the time periods T1-T4 will be gradually increased (i.e., T4>T3>T2>T1).

Next, operation S440 is executed again, determining, by the read-write controller 120, whether the threshold voltage of the target memory cell Cpg reaches the target level. If the threshold voltage of the target memory cell Cpg does not reach the target level, operations S461 and S463 are executed again. These operations are repeated until the threshold voltage of the target memory cell Cpg reaches the target level, then the program is completed and programming operation is ended. In other words, the read-write controller 120 controls the voltage generator 140 to generate the programming voltage (i.e., S1) and passing voltage (i.e., S3) with the longer time period (i.e., T4>T3>T2>T1) as new pulses every time to supply to the target memory cell Cpg and the other memory cells (including the adjacent memory cell Cad and the non-adjacent memory cell Cpp) except the target memory cell Cpg respectively, and so as to repeatedly operate until the threshold voltage of the target memory cell Cpg passes the verification.

In embodiments above, during the programming operation of the target memory cell Cpg, the word lines WL1~WLk−1 and WLk+1~WLm of the other memory cells (including the adjacent memory cell Cad and the non-adjacent memory cell Cpp) except the target memory cell Cpg are supplied to the same passing voltage (e.g., S3), so that the signal in the bit line BLn is able to arrival to the target memory cell Cpg, but the disclosure is not limited to this.

Figure 6:
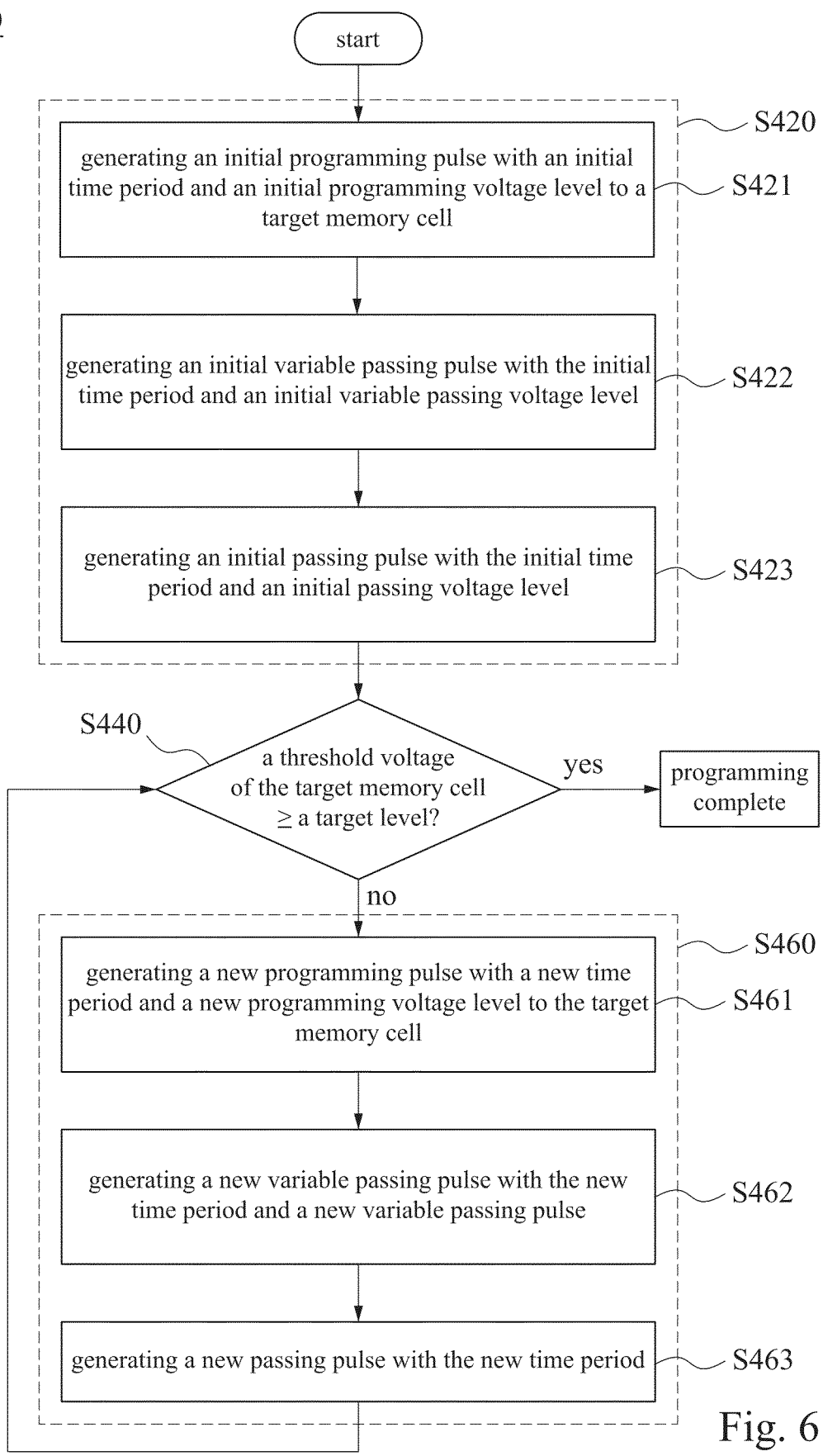
FIG. 6 is a flowchart of another non-volatile memory operation method illustrated in accordance with some other embodiments of the disclosure.
Figure 7:
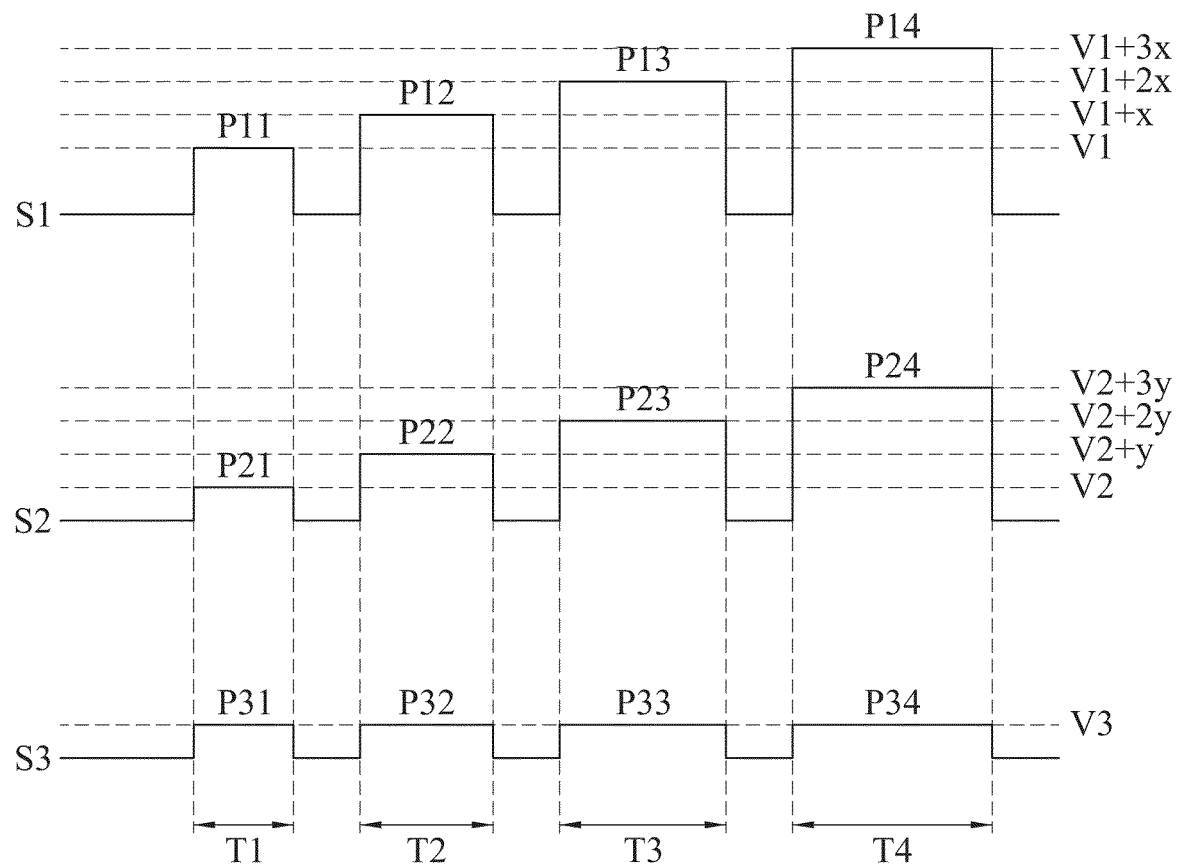
FIG. 7 is a waveform diagram of pulses illustrated in accordance with some other embodiments of the disclosure.

Please refer to FIG. 6 and FIG. 7 together. FIG. 6 is a flowchart of another non-volatile memory operation method 400 illustrated in accordance with some other embodiments of the disclosure. FIG. 7 is a waveform diagram of pulses illustrated in accordance with some other embodiments of the disclosure. It is important to note that, in embodiments of FIG. 6 and FIG. 7, the word lines of the adjacent memory cells Cad and the non-adjacent memory cell Cpp are not supplied the same passing voltage. To improve the efficiency of programming, the operating method 400 provides a variable passing voltage to the adjacent memory cell Cad on both sides of the target memory cell Cpg.

In the embodiments of FIG. 6, the elements similar to those in FIG. 4 are denoted by the same reference symbols, and the description described in the previous paragraph will not be described here. Compared with the embodiment shown in FIG. 4, in this embodiment, the non-volatile memory operation method 400 further includes operations S422 and S462.

In operation S422, controlling, by the read-write controller 120, the voltage generator 140 to generate an initial variable passing pulse with the initial time period to the adjacent memory cell Cad, and the initial variable passing pulse has an initial variable passing voltage level. Specifically, the variable passing voltage received by the adjacent memory cells Cad from the word lines WLk−1 and WLk+1 is as shown by the signal waveform S2 in FIG. 5. The read-write controller 120 controls the voltage generator 140 to generate the variable passing pulse P21 with the initial time period T1 to the adjacent memory cell Cad. For example, in some embodiments, the time period T1 may be about 5 microseconds. The initial variable passing voltage level V2 may be about 8 volts, and at the same time, the passing voltage level V3 of other non-adjacent memory cells Cpp may be also about 8 volts.

If it is not verified after the first programming pulse is completed, (that is, the threshold voltage of the target memory cell Cpg does not reach the target voltage level,) in operation S461, controlling, by the read-write controller 120, the voltage generator 140 to generate the new programming pulse with the new time period to the target memory cell Cpg, and in operation S462, controlling, by the read-write controller 120, the voltage generator 140 to generate the variable passing pulse with the new time period to the adjacent memory cell Cad, and the variable passing pulse has a new variable passing voltage level. Specifically, as shown in FIG. 5, the read-write controller 120 controls the voltage generator 140 to generate the programming pulse P12 with the new time period T2 to the target memory cell Cpg, and generate the variable passing pulse P22 with the new time period T2 to the adjacent memory cell Cad, and at the same time, the voltage generator 140 generates the passing pulse P32 with the new time period T2 to the non-adjacent memory cell Cpp. The new time period T2 is longer than the initial time period T1.

For example, in some embodiments, the time period T2 may be 5.8 microseconds. The new variable passing voltage V2+y may be about 8.5 volts. In other words, each additional programming voltage y may be approximately 0.5 volt. At the same time, the voltage level of the variable passing pulse P22 of the adjacent memory cell Cad is slightly higher than the voltage level of passing pulse P32 of the non-adjacent memory Cpp. Please refer to FIG. 2C together, when the programming pulse P12 supplied on the word line WLk attracts the electrons of the channel layer 103 to enter the charge trapping layer 104b on the left side of the word line WLk, the slightly higher variable passing pulse P22 (compared to the passing pulse P32) supplied on the word lines WLk−1 and WLk+1 will also attract the electrons of the channel layer 103 to approach the charge trapping layer 104b while passing through the word lines WLk−1, WLk and WLk+1, so as to increase the efficiency of electrons entering the charge trapping layer 104b on the left side of the word line WLk.

In some other embodiments, operation S462 further includes that determining, by the read-write controller 120, whether the variable passing voltage level of the variable passing pulse generated by the voltage generator 140 is higher than or equal to a setting voltage, in order to decide whether to increase the variable passing voltage level of the variable passing pulse. In some embodiments, the setting voltage is the upper limit of voltage that will not cause programming. For example, the setting voltage may be about 12 volts.

Specifically, if the read-write controller 120 determines the variable passing voltage level of the variable passing voltage S2 generated in the present is not higher than or equal to the setting voltage, the voltage generator 140 generates the variable passing pulse with a higher variable passing voltage level. As shown in FIG. 7, the read-write controller 120 controls the voltage generator 140 to generate the new the variable passing pulse P23 with variable passing voltage level V2+2y, and at the same time, the variable passing pulse P23 of the adjacent memory cell Cad is higher than the passing pulse P33 of the non-adjacent memory cell Cpp. In this example, the variable passing pulse P23 and the passing pulse P33 are 9 volts and 8 volts respectively, the slightly high variable passing pulse P23 (compared to the passing pulse P33) supplied to word lines WLk−1 and WLk+1 may be able to increase the efficiency of electrons entering the charge trapping layer 104b on the left side of the word line WLk.

On the other hand, if the read-write controller 120 determines the variable passing voltage level of the variable passing voltage S2 generated in the present is higher than or equal to the setting voltage, the voltage generator 140 generates the variable passing pulse with the same variable passing voltage as last time. In other words, the read-write controller 120 controls the voltage generator 140 to generate the variable passing pulse with the same variable passing voltage as last time, in order to keep the variable passing voltage S2 lower than or equal to the setting voltage (e.g., 12 volts), so as to avoid accidental programming to unselected memory cells.

Further example, as shown in FIG. 7, firstly, the voltage levels and the time period of the programming pulses P11, P12, P13 and P14 generated by the voltage generator 140 controlled by the read-write controller 120 are increased until the target memory cell Cpg passes the verification. That is, the voltage levels and the time period of the programming pulses P11, P12, P13 and P14 are in a relationship as V1+3x>V1+2x>V1+x>V1, and T4>T3>T2>T1. Similarly, the voltage levels and the time period of the variable passing pulses P21, P22, P23 and P24 are increased to supply additional electrical field to increase the ability of the target memory cell Cpg to attract electrons in the channel layer 103. That is, the voltage levels and the time period of the variable passing pulses P21, P22, P23 and P24 are in a relationship as V2+3y>V2+2y>V2+y>V2, and T4>T3>T2>T1. In addition, the time period of the passing pulses P31, P32, P33 and P34 are increased to coordinate with the time period of the programming pulses P11, P12, P13 and P14.

And so on, when the variable passing voltage level is higher than or equal to the setting voltage, the read-write controller 120 controls the voltage generator 140 to generate the variable passing pulse with the same variable passing voltage level. Or, when the threshold voltage of the target memory cell Cpg reaches the target level, the program is completed and the programming operation is ended.

It should be noted that the time period or the voltage level above are merely examples, but not intended to limit the present disclosure, and those skilled in the art may design values according to the actual needs. Specifically, in some embodiments, each additional time period and/or additional programming voltage (e.g., x and/or y in FIG. 7) may be the same. In other words, the time period, the programming voltage or the variable passing voltage may be increased by equivalence series. In some other embodiments, each additional time period and/or additional programming voltage may not totally be the same. In other words, the time period, the programming voltage or the variable passing voltage may be increased by other series or other setting values.

For example, the time period is adjusted once every two pulses. For another example, the voltage level of the programming voltage level is adjusted every pulse and the voltage level of the variable passing voltage level is adjusted every two pulses. The increasing frequency and proportion of the time periods or voltage levels above are merely examples, not limited to the disclosure.

Furthermore, in embodiments, operation S462 of the non-volatile memory operation method 400 may be skipped.

In other words, operation S463 is directly executed after operation S461 is executed. That is, during programming operation, each pulse is applied to the adjacent memory cell Cad with the passing voltage of the same voltage level.

The above non-volatile memory operation method 400 is described in accompanying with the non-volatile memory 100 and signals waveforms S1, S2 and S3 in the embodiments shown in previous paragraph, but not limited thereto. Various alterations and modifications may be performed on the disclosure by those of ordinary skilled in the art without departing from the principle and spirit of the disclosure.

In this way, in some embodiments, while the programming voltage applied to the target memory cell Cpg being gradually increased, the time periods of the programming pulses of the programming voltage are also gradually increased. In this case, the electrons will be easier to enter the charge trapping layer 104b through the tunnel oxide 104a, such that the electrons injection to the target memory cell Cpg will be enhanced, so as to enhance an efficiency of programming the target memory cell Cpg. In addition, in some other embodiments, the variable passing voltage applied to the adjacent memory cell Cad (adjacent to the target memory cell Cpg) can be gradually increased, the increased variable passing voltage also help the electrons injection to the target memory cell Cpg, and enhance the efficiency of programming the target memory cell Cpg.

Figure 8A:
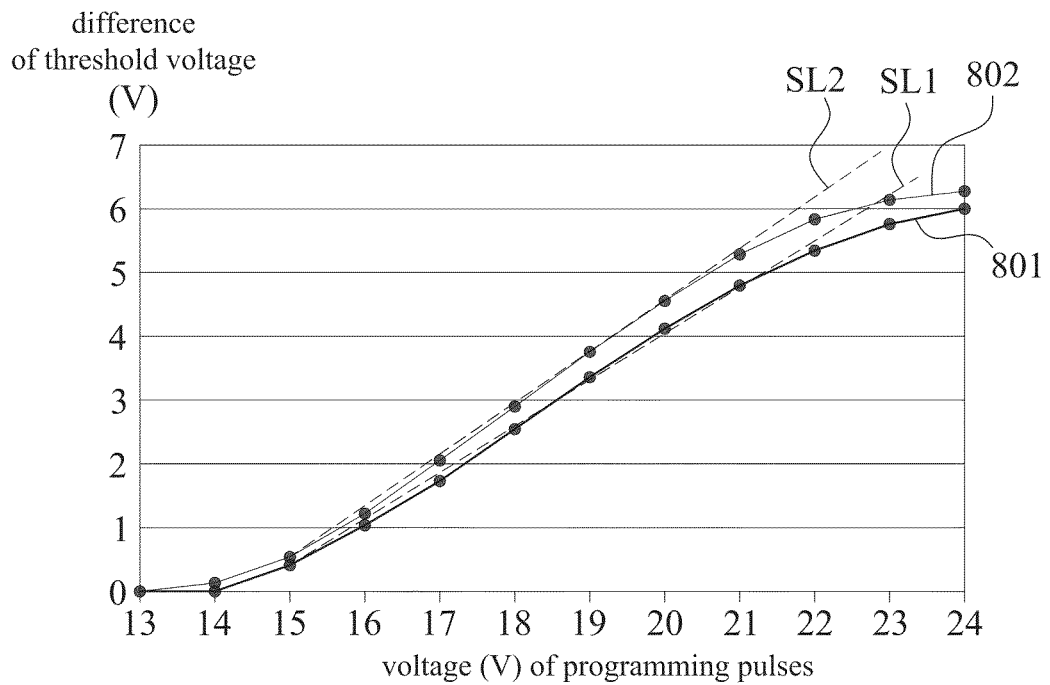
FIG. 8A and FIG. 8B are simulation diagrams of threshold voltage of a non-volatile memory illustrated in accordance with some embodiments of the disclosure.
Figure 8B:
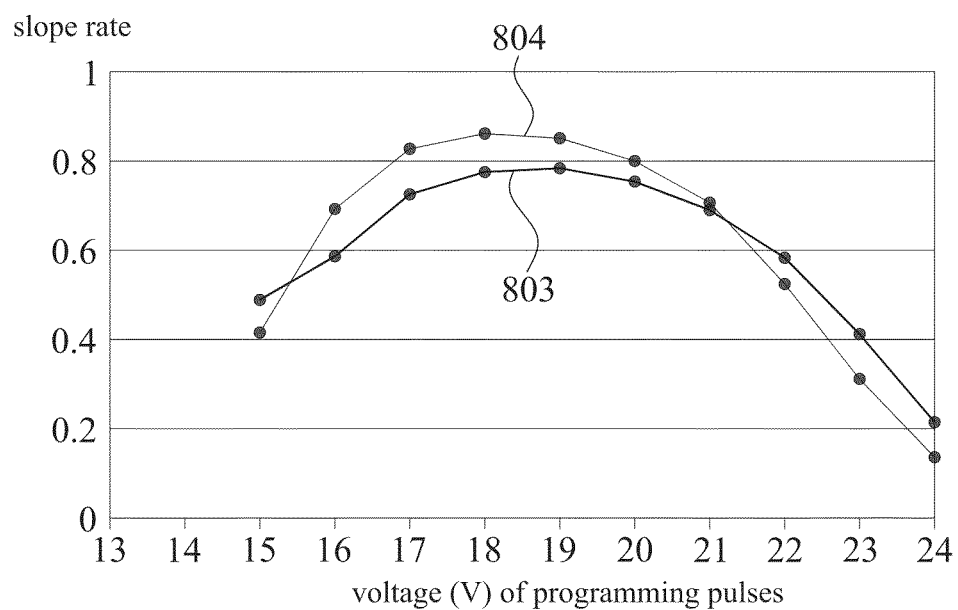

FIG. 8A and FIG. 8B illustrate a simulation diagram of threshold voltages of the non-volatile memory 100. As shown in FIG. 8A, a horizontal axis indicates a value of applied voltage, and a vertical axis indicates a difference of the threshold voltage being adjusted in each of programming pulses. While the applied voltages increasing, the threshold voltage of the target memory cell is adjusted in a faster pace correspondingly. In another demonstration manner as shown in FIG. 8B, a horizontal axis indicates a value of applied voltage, and a vertical axis indicates a slope rate corresponding to the difference of the threshold voltage being adjusted corresponding to each of programming pulses. While the applied voltages increasing, the threshold voltage of the target memory cell is adjusted in a steeper slope rate.

The simulation in FIG. 8A and FIG. 8B shows curves 802 and 804 corresponding to non-volatile memory operation method 400 in this disclosure, and also shows curves 801 and 803 corresponding to a conventional non-volatile memory operation method. According to the simulation, a slope rate SL1 of the curve 801 (of the conventional method) is about 0.75, and another slope rate SL2 of the curve 802 (of the disclosure) is about 0.83. As shown in FIG. 8A, the slope rate SL2 of the curve 802 is higher than the slope rate SL1 of the curve 801. In other words, each of the programming pulses based on the non-volatile memory operation method 400 can induce a larger adjustment to the threshold voltage of the target memory cell, such that the efficiency of the programming can be enhanced.

Figure 9:
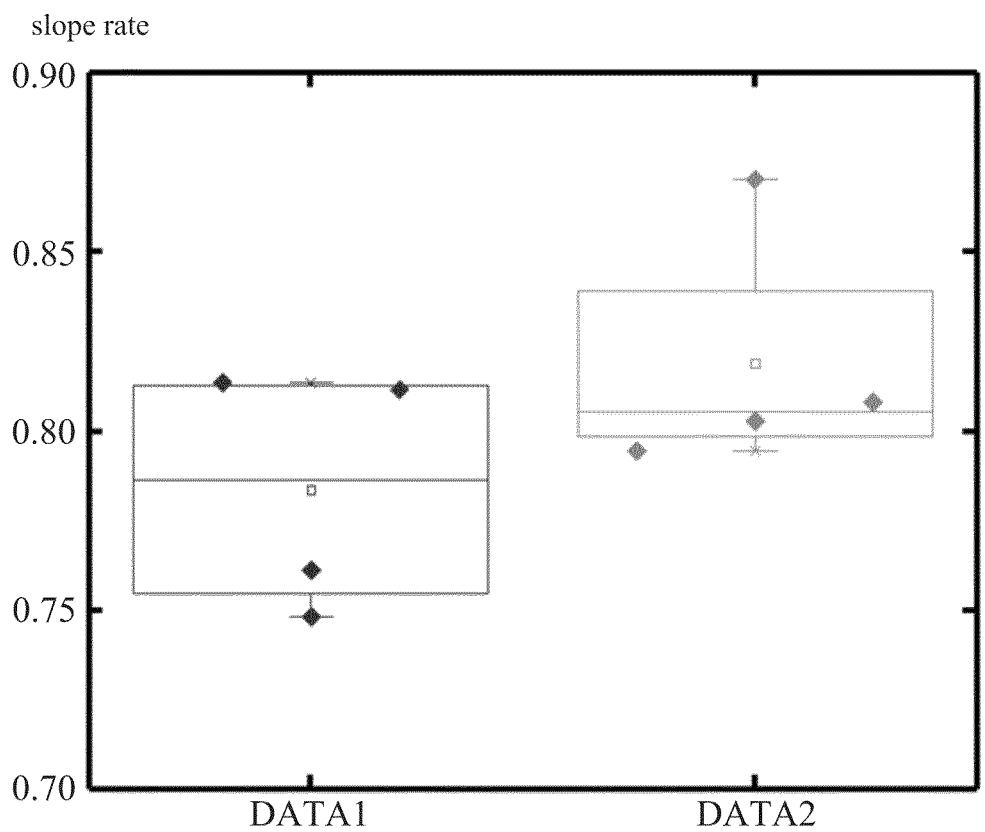
FIG. 9 is an experimental result diagram of threshold voltage of a non-volatile memory illustrated in accordance with some embodiments of the disclosure.

FIG. 9 is an experimental result diagram of threshold voltage of a non-volatile memory illustrated in accordance with some embodiments of the disclosure. As shown in FIG. 9, a vertical axis indicates slope rates, and DATA1 represents the experimental result of the conventional method and DATA2 represents the experimental result of the disclosure. According to the experimental result, a slope rate of DATA2 (of the disclosure) is higher than a slope rate of DATA1 (of the conventional method). Moreover, in this experimental result, the slope rate of DATA2 is higher than the average of the slope rate of DATA1. In other words, it proves that the non-volatile memory operation method 400 can induce a larger adjustment to the threshold voltage of the target memory cell, such that the efficiency of the programming can be enhanced.

In the foregoing, exemplary operations are included. However, these operations do not need to be performed sequentially. The operations mentioned in the embodiment may be adjusted according to actual needs unless the order is specifically stated, and may even be performed simultaneously or partially simultaneously.

In aforesaid embodiments, the programming voltage applied to the target memory cell Cpg and the time periods of the programming pulses applied to the target memory cell Cpg are gradually increased, so as to improve a programming ability of the non-volatile memory 100 and enhance the efficiency of programming the non-volatile memory 100.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A non-volatile memory, comprising:
    a memory array, comprising a plurality of memory cells, wherein each of the plurality of memory cells has an adjustable threshold voltage, the plurality of memory cells comprise a target memory cell and an adjacent memory cell adjacent to each other, and the adjacent memory cell and the target memory cell are connected in series at a bit line;
    a voltage generator, coupled to the memory array, configured to generate a programming voltage to perform a programming operation to the target memory cell, wherein the programming operation is configured to arrange the threshold voltage of the target memory cell, and when performing the programming operation to the target memory cell, the voltage generator is configured to generate a variable passing voltage to the adjacent memory cell; and
    a read-write controller, coupled to the voltage generator, and configured to:
        control the voltage generator to generate a first programming pulse of the programming voltage with a first time period to the target memory cell;
        control the voltage generator to generate a first variable passing pulse of the variable passing voltage with the first time period to the adjacent memory cell;
        read and verify whether the threshold voltage of the target memory cell reaches a target voltage level; and
        when the threshold voltage of the target memory cell does not reach the target voltage level, control the voltage generator to generate a second programming pulse of the programming voltage with a second time period to the target memory cell, and also control the voltage generator to generate a second variable passing pulse of the variable passing voltage with the second time period to the adjacent memory cell, wherein the second time period is longer than the first time period;
    wherein the first variable passing pulse and the second variable passing pulse have a third voltage level and a fourth voltage level, respectively,
    if a sum of the third voltage level and an additional programming voltage level is higher than or equal to a setting voltage, the voltage generator sets the fourth voltage level to the third voltage level, if the sum is smaller than the setting voltage, the voltage generator sets the fourth voltage level to the sum.

2. The non-volatile memory of claim 1, wherein the first programming pulse generated by the voltage generator controlled by the read-write controller has a first voltage level, the second programming pulse generated by the voltage generator controlled by the read-write controller has a second voltage level, and the second voltage level is higher than the first voltage level.

3. The non-volatile memory of claim 1, wherein the programming voltage generated by the voltage generator comprises a plurality of programming pulses having a plurality of programming voltage levels, the programming voltage levels are ranged from a lower programming voltage boundary to a higher programming voltage boundary, the fourth voltage level of the second variable passing pulse is lower than the lower programming voltage boundary.

4. The non-volatile memory of claim 1, wherein the plurality of memory cells of the memory array further comprise a non-adjacent memory cell, the non-adjacent memory cell and the target memory cell are connected in series at the same bit line, wherein while performing the programming operation to the target memory cell, the voltage generator is configured to generate a passing voltage to the non-adjacent memory cell, the read-write controller is configured to:

control the voltage generator to generate a first passing pulse of the passing voltage with the first time period to the non-adjacent memory cell; and control the voltage generator to generate a second passing pulse of the passing voltage with the second time period to the non-adjacent memory cell when the threshold voltage of the target memory cell does not reach the target voltage level.

5. The non-volatile memory of claim 4, wherein the first passing pulse generated by the voltage generator controlled by the read-write controller has a fifth voltage level, the second passing pulse generated by the voltage generator controlled by the read-write controller is configured to have the same fifth voltage level.

6. The non-volatile memory of claim 5, wherein the fourth voltage level of the second variable passing pulse is higher than the fifth voltage level of the second passing pulse generated by the voltage generator.

7. The non-volatile memory of claim 4, wherein the passing voltage and the variable passing voltage are utilized to configure the non-adjacent memory cell and the adjacent memory cell to pass a data signal on the same bit line to the target memory cell.

8. The non-volatile memory of claim 1, wherein the programming voltage is utilized to adjust the threshold voltage of the target memory cell.

9. An operating method, comprising:

generating a first programming pulse of a programming voltage with a first time period to a target memory cell in a memory array;

generating a first variable passing pulse of a variable passing voltage with the first time period to an adjacent memory cell, adjacent to the target memory cell, in the memory array while generating the first programming pulse to the target memory cell;

reading and verifying whether a threshold voltage of the target memory cell reaches a target voltage level;

when the threshold voltage of the target memory cell does not reach the target voltage level, generating a second programming pulse of the programming voltage with a second time period to the target memory cell, and also generating a second variable passing pulse of the variable passing voltage with the second time period to the adjacent memory cell, wherein the second time period is longer than the first time period, wherein the first variable passing pulse and the second variable passing pulse have a third voltage level and a fourth voltage level, respectively;

if a sum of the third voltage level and an additional programming voltage level is higher than or equal to a setting voltage, the voltage generator sets the fourth voltage level to the third voltage level; and if the sum is smaller than the setting voltage, the voltage generator sets the fourth voltage level to the sum.

10. The operating method of claim 9, wherein the first programming pulse has a first voltage level, the second programming pulse has a second voltage level, and the second voltage level is higher than the first voltage level.

11. The operating method of claim 9, wherein the programming voltage comprises a plurality of programming pulses having a plurality of programming voltage levels, the programming voltage levels are ranged from a lower programming voltage boundary to a higher programming voltage boundary, the fourth voltage level of the second variable passing pulse is lower than the lower programming voltage boundary.

12. The operating method of claim 9, further comprising:

generating a first passing pulse with the first time period to a non-adjacent memory cell in the memory array while generating the first programming pulse to the target memory cell; and generating a second passing pulse with the second time period to the non-adjacent memory cell when the threshold voltage of the target memory cell does not reach the target voltage level.

13. The operating method of claim 12, wherein the first passing pulse has a fifth voltage level, the second passing pulse is configured to have the same fifth voltage level.

14. The operating method of claim 13, wherein the fourth voltage level of the second variable passing pulse is higher than the fifth voltage level of the second passing pulse.

15. The operating method of claim 12, wherein the passing voltage and the variable passing voltage are utilized to configure the non-adjacent memory cell and the adjacent memory cell to pass a data signal on a bit line to the target memory cell.

16. The operating method of claim 9, wherein the programming voltage is utilized to adjust the threshold voltage of the target memory cell.

* * * * *